United States Patent [19]
Lucas

[11] Patent Number: 5,870,274
[45] Date of Patent: Feb. 9, 1999

[54] CAPACITIVE PCB WITH INTERNAL CAPACITIVE LAMINATE

[75] Inventor: Gregory L. Lucas, Newark, Calif.

[73] Assignee: Hadco Santa Clara, Inc., Santa Clara, Calif.

[21] Appl. No.: 880,661

[22] Filed: Jun. 23, 1997

Related U.S. Application Data

[63] Continuation of Ser. No. 147,671, Nov. 3, 1993, which is a continuation-in-part of Ser. No. 864,440, Apr. 6, 1992, Pat. No. 5,261,153.

[51] Int. Cl.$^6$ .............................. H01G 4/06; H01G 4/20; N32B 9/00
[52] U.S. Cl. ......................... 361/311; 361/313; 361/763; 361/312
[58] Field of Search ........................ 361/311–313, 321.1, 361/321.2, 321.3, 321.4, 321.5, 734, 763, 766, 782, 811, 821; 174/250, 252; 428/209, 426

[56] References Cited

U.S. PATENT DOCUMENTS

5,079,069  1/1992  Howard et al. ...................... 428/209

*Primary Examiner*—Kristine Kincaid
*Assistant Examiner*—Anthony Dinkins
*Attorney, Agent, or Firm*—Testa, Hurwitz & Thibeault, LLP

[57] ABSTRACT

An in situ method for forming a bypass capacitor element internally within a PCB including the steps of arranging one or more uncured dielectric sheets with conductive foils on opposite sides thereof and laminating the conductive foils to the dielectric sheet simultaneously as the PCB is formed by a final lamination step, the conductive foils preferably being laminated to another layer of the PCB prior to their arrangement adjacent the dielectric sheet or sheets, the dielectric foils even more preferably being initially laminated to additional dielectric sheets in order to form multiple bypass capacitive elements as a compound subassembly within the PCB. A number of different dielectric materials and resins are disclosed for forming the capacitor element. A dielectric component in the capacitor element preferably includes dielectric material and thermally responsive material, the thermally responsive material either forming a carrier for the dielectric material or formed as two separate sheets on opposite sides of a sheet of the dielectric material.

17 Claims, 5 Drawing Sheets

CAPACITIVE PCB WITH INTERNAL CAPACITIVE LAMINATE

This is a continuation Ser. No. 08/147,671 filed on Nov. 3, 1993, which is a continuation-in-part of Ser. No. 07/864,440 filed Apr. 6, 1992, now U.S. Pat. No. 5,261,153.

FIELD OF THE INVENTION

The present invention relates to methods for forming a capacitive printed circuit board (PCB), more particularly to methods for forming a bypass capacitive element internally within the PCB, and also to a PCB formed thereby.

BACKGROUND OF THE INVENTION

Printed circuit boards (PCBs) are commonly formed with internal power and ground planes which are connected with surface devices such as integrated circuits mounted on the PCBs. In the operation of the PCBs, it is commonly necessary to compensate for voltage fluctuations arising between the power and ground planes in the PCBs, particularly when sensitive devices such as integrated circuits are mounted on the board and connected with the power and ground planes for operation.

Voltage fluctuations of the type referred to above are commonly caused by the integrated circuits switching on and off, the fluctuations resulting in "noise" which is undesirable and/or unacceptable in many applications.

A preferred solution to this problem has been the provision of capacitors connected directly with the integrated circuits and/or with the power and ground planes in the vicinity of selected integrated circuits. Initially, surface capacitors were formed with the surface devices or separately mounted upon the surface of the PCB and connected with the respective devices or integrated circuits, etc., either by surface traces or by through-hole connections, for example.

Surface capacitors of this type were generally effective to reduce or minimize undesirable voltage fluctuations for the devices. However, surface or bypass capacitors have not always been effective in all applications. For example, the capacitors may tend to affect "response" of the integrated circuits or other devices because the capacitors have not only a capacitive value but an inductive value as well. In this regard, it is well known that inductance arises because of currents passing through conductors such as the traces or connectors coupling the capacitors with the devices or power and ground planes.

Furthermore, the integrated circuits or other devices are a primary source of radiated energy creating noise from voltage fluctuations in the PCBs. Different characteristics are commonly observed for such devices operating at different speeds or frequencies. Accordingly, the, PCBs and device arrays as well as associated capacitors must commonly be designed to assure necessary noise suppression at both high and low speed operation.

The design of PCBs and device arrays as discussed above are well known to those skilled in the art of printed circuit board design. For purposes of the present invention, it is sufficient to realize that the use of surface mounted capacitors which are individually connected with the integrated circuits or devices substantially increase the complexity and cost of manufacture for the PCBs as well as undesirably affecting their reliability.

In order to overcome these limitations or for other reasons, a number of capacitive PCBs have been provided in the prior art. Initially, U.S. Pat. No. 4,775,573 issued Oct. 4, 1988 to Turek disclosed a multilayer printed circuit board having conductive and dielectric layers deposited on a surface of the board in order to form a bypass capacitor for devices mounted on the board.

More recently, U.S. Pat. No. 5,010,641 issued Apr. 30, 1991 to Sisler disclosed a method of making a multilayer printed circuit board with a fully cured dielectric material positioned between power and ground plane layers therein.

Still further, U.S. Pat. No. 5,079,069 issued Jan. 7, 1992 to Howard, et al. and assigned to Zycon Corporation, the assignee of the present invention, disclosed a capacitive printed circuit board including a capacitor laminate therein to provide a bypass capacitive function for devices mounted or formed on the PCB.

The printed circuit board variations disclosed above were suitable for their intended purposes. However, there has been found to remain a need for further improvements in methods for forming such PCBs and particularly for forming capacitive PCBs of the type disclosed by the Zycon patent noted above.

SUMMARY OF THE INVENTION

Accordingly, it is an object of the present invention to provide a method for in situ formation of a bypass capacitor element in a capacitive PCB.

More specifically, it is an object of the invention to provide such an in situ method wherein an uncured dielectric sheet is arranged between conductive foils to form a bypass capacitor element which is then arranged between layers of a PCB and laminated therein simultaneously as the PCB is formed by a final lamination step.

Preferably, the conductive foils are initially laminated or bonded to other layers of the PCB with portions of the foils being etched away prior to assembly adjacent the uncured dielectric sheet and lamination into the capacitive PCB.

It is a further object of the invention to provide such an in situ method wherein the conductive foils form power and ground planes within the PCB while being interconnected with surface devices on the PCB in order to supply capacitance for the devices.

It is a still further object of the invention to provide such an in situ method wherein one or more additional uncured dielectric sheets are similarly arranged between conductive foils and then laminated into the capacitive PCB, at least some of the conductive foils forming a part of two adjacent bypass capacitive elements in order to provide a compound bypass capacitive subassembly within the PCB.

It is a related object of the invention to provide an in situ method of forming a bypass capacitor element internally within a capacitive PCB comprising the steps of selecting a dielectric component comprising a thermally responsive material and a dielectric material providing a selected dielectric constant and conductive foils as components of the bypass capacitor element, arranging the conductive foils as layers adjacent both sides of the un-cured dielectric sheet and between other PCB layers, and thereafter laminating the conductive foils to the dielectric sheet in a final lamination step simultaneously forming the capacitive PCB and the internal bypass capacitor element.

It is a further related object of the invention to provide a method as summarized above wherein the dielectric material is a nanopowder-loaded electrically insulative material including a pre-fired ceramic powder having a high dielectric constant.

It is also a further related object of the invention to provide such a method wherein the dielectric component comprises a thin film of filled polytetrafluoroethylene containing a high dielectric constant particulate filler.

It is a still further related object of the invention to provide such a dielectric component having opposed first and second conductive top and bottom surfaces, the dielectric material having a pair of opposed end surfaces and top and bottom surfaces with the conductive top and bottom surfaces on the respective top and bottom surfaces of the dielectric material, the dielectric component also having a mutually parallel interleaved conductive layer between and parallel to the conductive top and bottom surfaces, with the top conductive surface being in electrical contact with the first conductor and the bottom conductive surface being in electrical contact with the second conductor whereby the first conductor, second conductor, conductive top surface, conductive bottom surface and interleaved conductive layers are all mutually parallel.

It is also a further related object of the invention to provide such a method wherein the dielectric component comprises an array of spaced high dielectric chips arranged in a single layer and a binder comprising a flexible thermoplastic polymer or a flexibilized thermoset polymer between side surfaces of the chips and binding the chips to define a cohesive sheet.

It is yet a further related object of the invention to provide a capacitive printed circuit board comprising a generally continuous sheet of dielectric material with sheets of thermally responsive material forming a laminated bond between opposite sides of the dielectric sheet and respective conductive foils.

Additional objects and advantages of the invention are made apparent in the following specification having reference to the accompanying drawings.

DESCRIPTION OF THE PREFERRED EMBODIMENTS

An in situ method for forming a bypass capacitor element internally within a capacitive printed circuit board (PCB) is described in greater detail below. Such capacitive PCBs commonly support large numbers of devices which are typically mounted on surfaces of the board. Substantial amounts of capacitance may be required for the devices on the PCB. In this regard, the above noted Zycon patent initially disclosed the concept of borrowed or shared capacitance and, for that reason, is incorporated herein by reference as through set forth in its entirety. According to this concept of borrowed or shared capacitance, capacitive elements in the PCB are capable of satisfying capacitive requirements for surface devices even though the total capacitance requirements for the devices are greater than the capacitance of the bypass capacitive elements. According to the above patent, such operation was made possible based on intermittent operation of the devices so that actual capacitance requirements of the devices at any given time are only a fraction of the cumulative capacitive requirements for all the devices.

Even though the present invention contemplates the use of such a concept of borrowed or shared capacitance, it is also important to understand that the bypass capacitor element of the invention may in fact be capable of simultaneously satisfying the cumulative capacitive requirements for all of the devices. For example, with the bypass capacitor element of the invention being of a compound type as preferably described in greater detail below, it is possible to provide a substantial number of capacitor elements within the PCB, each of the capacitor elements extending substantially throughout the surface area of the board. In this manner, it is accordingly possible to substantially increase the available capacitance provided in the capacitive PCB of the invention. Secondly, it is also possible to substantially increase the total capacitance of the capacitive PCB by using dielectric materials of substantially increased dielectric constant. Accordingly, the present invention contemplates not only a capacitive PCB based on the concept of borrowed or shared capacitance as noted above but also a capacitive PCB wherein the total capacitance is approximately equal to or even in excess of total capacitive requirements for devices mounted on the PCB.

Figure 1:
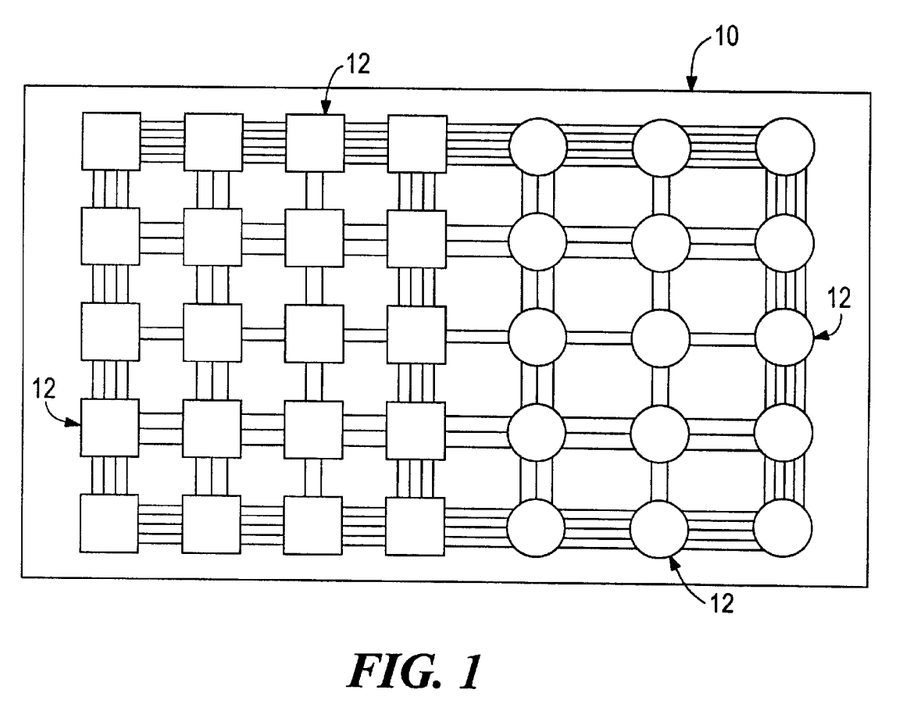
FIG. 1 is a plan view of a capacitive printed circuit board (PCB) constructed according to the present invention.

Referring initially to FIG. 1, a capacitive PCB constructed according to the present invention is generally indicated at 10. The printed circuit board 10 is of generally conventional construction except for the provision of an internal capacitor laminate as described in greater detail, below. Accordingly, external features of the capacitive printed circuit board 10 are only briefly noted, the architecture and design considerations for the printed circuit board otherwise being generally of a type well known to those skilled in the art.

For purposes of the present invention, it is sufficient to understand that the capacitive PCB 10 is of a type including large numbers of devices 12 arranged upon its surfaces. In accordance with well known printed circuit board technology, the devices or components may be arranged upon one or both sides of the board and may include active devices such as integrated circuits, transistors, etc. Such active devices may even include components such as vacuum tubes or the like. The devices 12 may also include passive devices such as capacitors, resistors, inductors, etc.

In the design of PCBs such as that illustrated at 10, it is common practice to employ a power source described and illustrated in greater detail below which is embodied by power and ground planes or conductors formed as laminates in the printed circuit board itself. A variety of configurations are provided for mounting the devices upon the PCB and for interconnecting them both with the power source and each other. Although such design considerations are generally outside the scope of the present invention, two such configurations are described below with reference to FIGS. 2 and 3.

Figure 2:
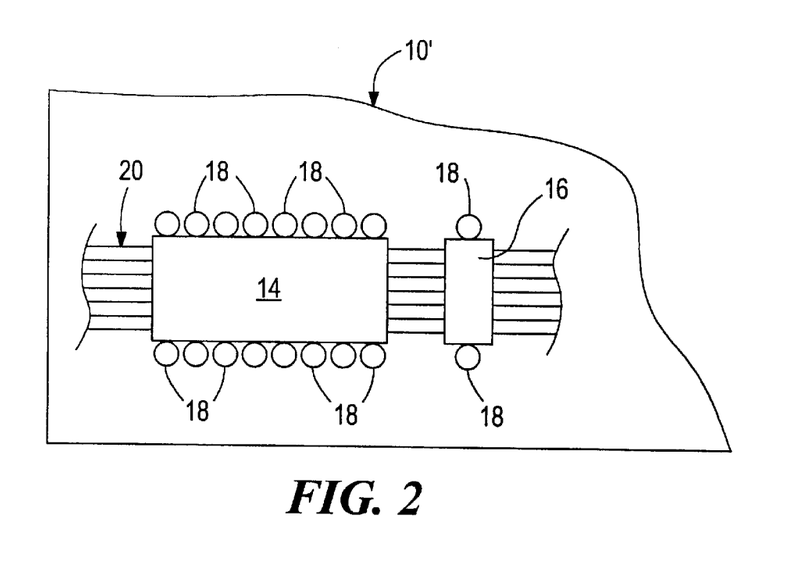
FIG. 2 is an enlarged fragmentary view of a portion of the printed circuit board showing a device such as an integrated circuit mounted on the board and connected with other devices and a power source in the board by through-hole connections.

Referring to FIG. 2, an active device such as an integrated circuit is indicated at 14 with a passive device, specifically a capacitor being generally indicated at 16. These devices, particularly the active device or integrated circuit 14, are representative of large numbers of devices arranged upon the printed circuit board as generally indicated in FIG. 1. In a configuration of the type illustrated in FIG. 2, the devices are interconnected to power and ground planes within the printed circuit board and to other devices by through-hole connectors or pins generally indicated at 18. In FIG. 2, two such connectors or pins 18 are illustrated for the capacitor 16 while the integrated circuit 14 is of a 16-pin design including 16 through-hole connectors or pins 18 as illustrated. Additional traces may be provided as generally indicated at 20 for facilitating interconnection of the various devices upon the printed circuit board.

Figure 3:
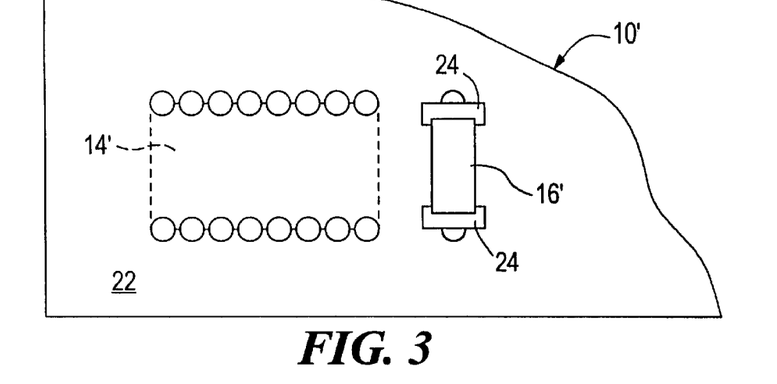
FIG. 3 is a view similar to FIG. 2 while illustrating a surface mounted device arranged upon the board and connected with other devices or components and a power source in the board by surface traces or paths.

Another configuration for a printed circuit board is indicated by the fragmentary representation of FIG. 3 which similarly illustrates an active device such as an integrated circuit being generally indicated at 14' and illustrated in phantom since it is mounted on the opposite or top surface of the circuit board from the bottom surface illustrated in FIG. 3. A passive device or capacitor 16' is also illustrated in FIG. 3 preferably mounted on the bottom surface 22 of the printed circuit board. In the surface mounted configuration of FIG. 3, both the active device 14' and the capacitor 16' are mounted upon surface traces or pads 24. In accordance with well known techniques in the printed circuit board technology, the pads 24 facilitate surface mounting of the devices while providing for interconnection of the devices with each other and with a power source such as the internal power and ground planes referred to above by both surface traces and through-hole connectors or pins where necessary.

With reference to both FIGS. 2 and 3, the present invention particularly contemplates the use of an internal capacitive layer in the form of the capacitor laminate of the present invention in order to replace large numbers of surface capacitors. Accordingly, although most of the surface capacitors are replaced in the printed circuit board 10 by the capacitor laminate of the invention, a limited number of surface capacitors may still be desirable as illustrated in FIGS. 2 and 3, at least for the purpose of achieving low frequency tuning as discussed in greater detail below.

Figure 4:
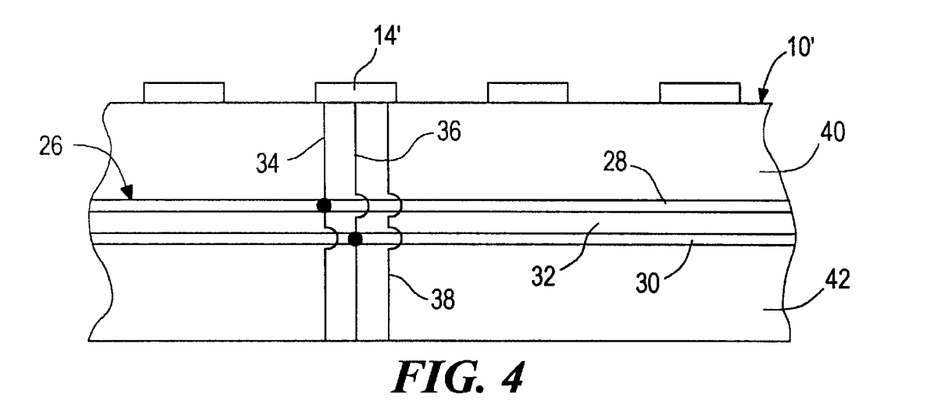
FIG. 4 is a schematic sectional view of a printed circuit board illustrating connections or traces for coupling a representative surface device on the board to power and ground planes formed by an internal capacitor arranged within the PCB and constructed according to the present invention.

FIG. 4 is a sectional view of the capacitive PCB of FIG. 1 and illustrates a bypass capacitor element or subassembly 26 constructed according to the method of the present invention for forming an internal capacitive device within the printed circuit board 10. The bypass capacitor element 26 includes conductive foils 28 and 30 arranged on opposite sides of a dielectric sheet 32. Preferably, the conductive foils 28 and 30 form power and ground planes which are interconnected with the surface device 14' by respective power and ground leads 34 and 36. Additional signal traces such as that indicated at 38 are also provided for interconnecting devices on the PCB or for making other connections within the PCB as necessary. The PCB 10' of FIG. 4 also includes additional layers 40 and 42 arranged on opposite sides of the capacitor element 26.

Figure 5:
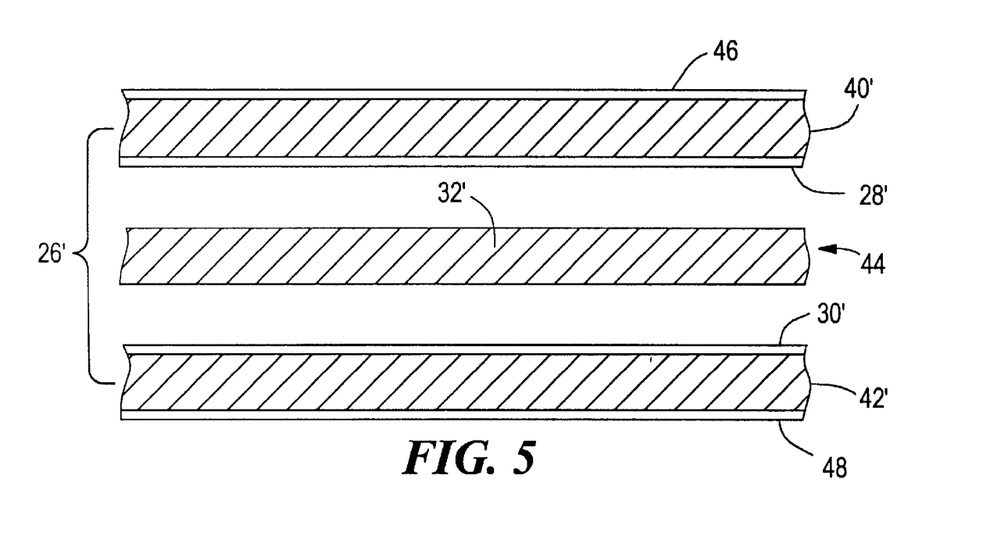
FIG. 5 illustrates an exploded assembly of components suitable for forming a capacitive PCB according to the in situ method of the present invention.

Referring now to FIG. 5, an exploded assembly of components is generally indicated at 44 for forming a capacitive PCB such as those indicated at 10 and 10' in FIGS. 1–4 according to the in situ method of the present invention. Accordingly, the assembly 44 includes conductive foils 28' and 30' arranged on opposite sides of a dielectric sheet 32' to form a capacitor element 26' generally corresponding to that indicated at 26 in FIG. 4. However, in the assembly of FIG. 5, it is important to note that the dielectric layer or sheet 32' is uncured or in a so-called "B" stage according to conventional PCB terminology. Additional PCB layers such as those indicated at 40' and 42' are arranged on opposite sides of the conductive foils 28' and 30'. Preferably, the layers 40' and 42' are respectively laminated to the conductive foils 28' and 30' so that the conductive foils can be etched prior to their arrangement within the assembly 44. Even more preferably, the conductive foils 28 and 30' form power and ground planes for the PCB 10'. In accordance with conventional PCB practice, portions of the conductive foils or power and ground planes 28' and 30' are etched away or removed. This allows for formation of through-holes in the PCB for receiving leads such as those indicated at 34, 36 and 38 in FIG. 4.

Additional conductive foils layers 46 and 48 may be laminated to exterior surfaces of the layers 40' and 42'. With the layers 40' and 42' being formed from dielectric material, they are of course converted to a fully cured or so-called "C" stage during lamination to the conductive foils 28' and 30' as well as the outer foils 46 and 48.

With the components of the assembly 44 arranged as illustrated in FIG. 5, they are subjected to heat and pressure in a conventional final lamination step well known to those skilled in the printed circuit board art to form a PCB such as that indicated at 10 or 10' in FIGS. 1–4 with simultaneous in situ formation or lamination of the capacitor element 26' including the conductive foils 28' and 30' as well as the dielectric sheet 32'. During the final lamination step, the dielectric sheet 32' is laminated to both of the conductive foils 28' and 30' while also being converted to a fully cured or "C" stage condition generally similar to the other layers 40' and 42'.

Figure 6A:
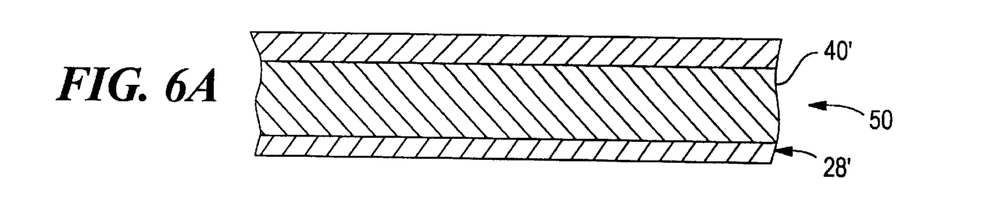
FIGS. 6A, 6B, 6C and 6D illustrate the in situ process of the present invention for forming a capacitive PCB and simultaneously forming a bypass internal capacitor therein.

The method of the present invention is described in somewhat greater detail below in FIGS. 6A–6B. Referring initially to FIG. 6A, an initial lamination product 50 is obtained or formed including the fully cured dielectric sheet 40' with conductive foils 28' and 46' laminated or bonded on opposite sides thereof.

Figure 6B:
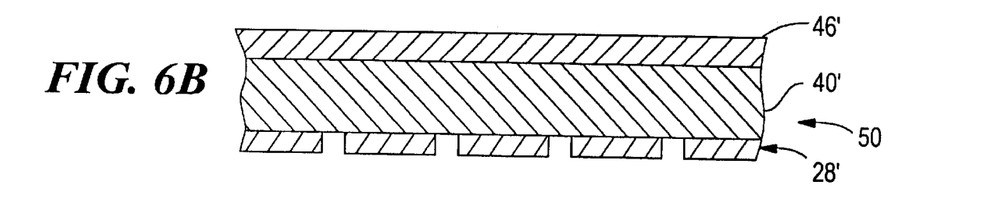

Referring also to FIG. 6B, with the conductive foil 28' forming for example a power plane for a PCB, the conductive foil 28' is then etched as indicated in FIG. 6B for reasons discussed in greater detail above.

Figure 6C:
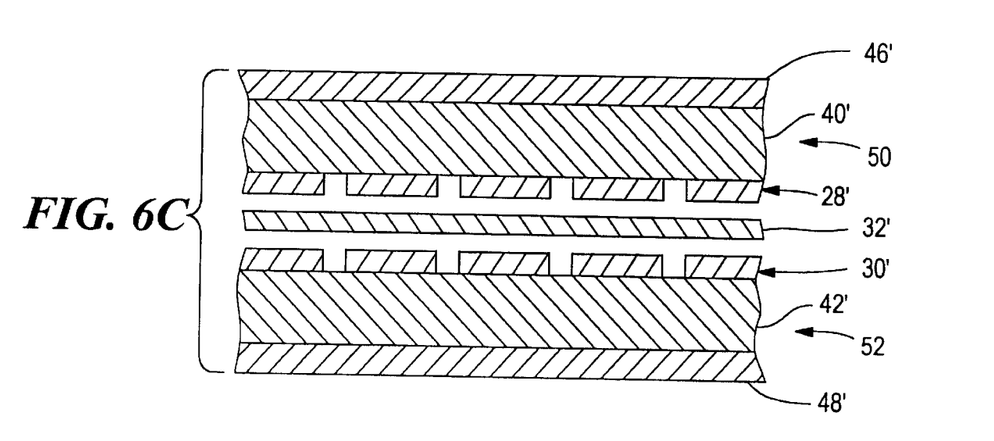

Referring now to FIG. 6C, another lamination product 52 is formed in a similar manner as the lamination product 50. The lamination product 52 includes the other PCB layer 42' and the conductive foils 30' and 48'. The conductive foil 30' also preferably forms a ground plane for a resulting PCB and is similarly etched as the conductive foil 28' in FIG. 6B.

Continuing with reference to FIG. 6C, the uncured dielectric sheet 32' is then arranged between the lamination products 50 and 52 so that it is adjacent to both the conductive foils or power and ground planes 28' and 30'.

Figure 6D:
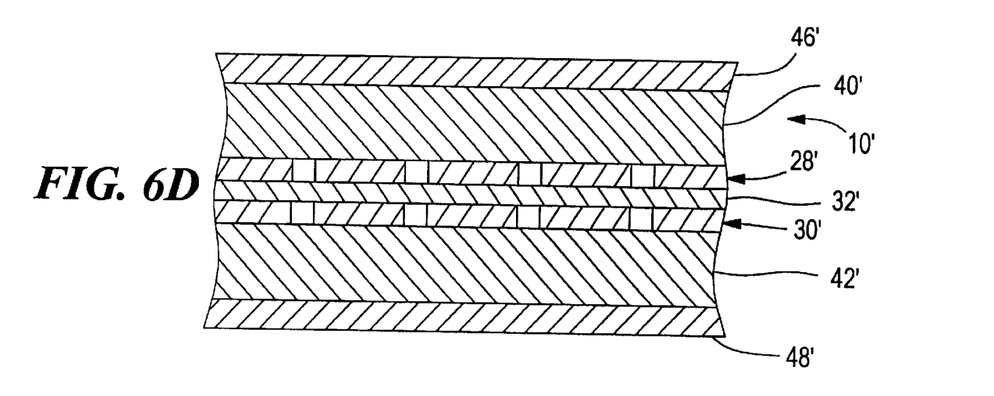

With the lamination products 50 and 52 arranged on opposite sides of the uncured dielectric sheet 32' as illustrated in FIG. 6C, they are then subjected to heat and pressure in a conventional final lamination step as described above for forming the PCB with simultaneous in situ formation of the capacitor element 26' from the dielectric sheet 32' and the conductive foils 28' and 30'. Here again, the final lamination step results in conversion of the uncured dielectric sheet 32' to a fully cured or "C" stage condition as described above. The final lamination step described above with reference to FIG. 6C results in formation of a finished capacitive PCB 10' as illustrated in FIG. 6D.

The preceding method described particularly with reference to FIGS. 5 and 6A–6D can also be carried out with additional capacitor elements formed within the PCB during the final lamination step, similar to the capacitor element 26'. Such an arrangement is not illustrated in the drawings but simply includes one or more additional capacitor elements such as that indicated at 26 or 26' similarly formed during final lamination of the PCB and preferably spaced apart by additional PCB layers (not shown).

The method of the present invention also contemplates formation of the capacitor elements as compound bypass capacitor subassemblies formed according to the method of the present invention as described below with reference to FIGS. 7 and 8.

Figure 7:
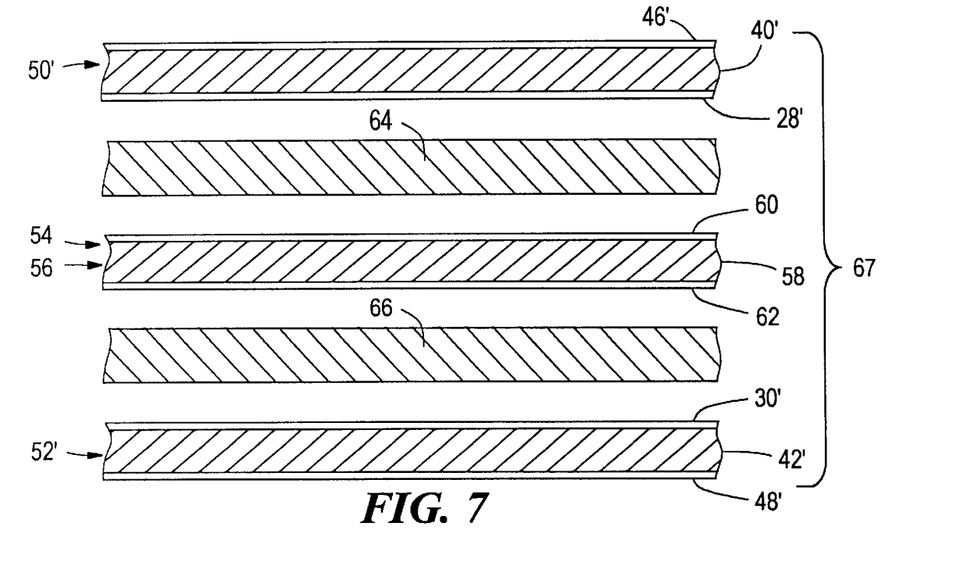
FIGS. 7 and 8 illustrate additional embodiments of the method of the present invention for in situ formation of compound bypass internal capacitors within a capacitive PCB according to the present invention.

Referring initially to FIG. 7, an exploded assembly 54 includes lamination product 50' and 52' similar to the lamination products 50 and 52 of FIGS. 6A–6D. An additional lamination product 56 is centrally arranged within the assembly 54 between the lamination products 50' and 52'. The lamination product 56 includes a fully cured dielectric sheet 58 laminated to conductive foils 60 and 62.

With the assembly as described above, the conductive foils 28' and 62 are preferably power planes for a PCB resulting from the assembly of FIG. 7 with the conductive foils 30' and 60 being ground planes for the PCB. All of the conductive foils 28', 30', 60 and 62 may be etched if desired after they are laminated respectively onto their supporting dielectric sheets.

Thereafter, uncured dielectric sheets 64 and 66 are arranged respectively between the conductive foils 28', 60 and 30', 62. The components of the assembly 54 are then subjected to heat and pressure, again in a conventional manner for a final lamination step to result in formation of the PCB and simultaneous in situ formation of a compound bypass capacitive subassembly 64. The subassembly 64 includes three capacitive elements formed respectively by the conductive foils 28' and 60 together with the dielectric sheet 64, the conductive foils 60 and 62 together with the dielectric sheet 58 and the conductive foils 30' and 62 together with the dielectric sheet 66. The dielectric sheets 64 and 66 are of course converted to a fully cured or "C" stage condition during the final lamination step. Within the subassembly 64, it may also be seen that certain of the conductive foils, particularly those indicated at 60 and 62 are included in multiple capacitor elements to achieve greater efficiency and an increased capacitance for the resulting PCB.

Figure 8:
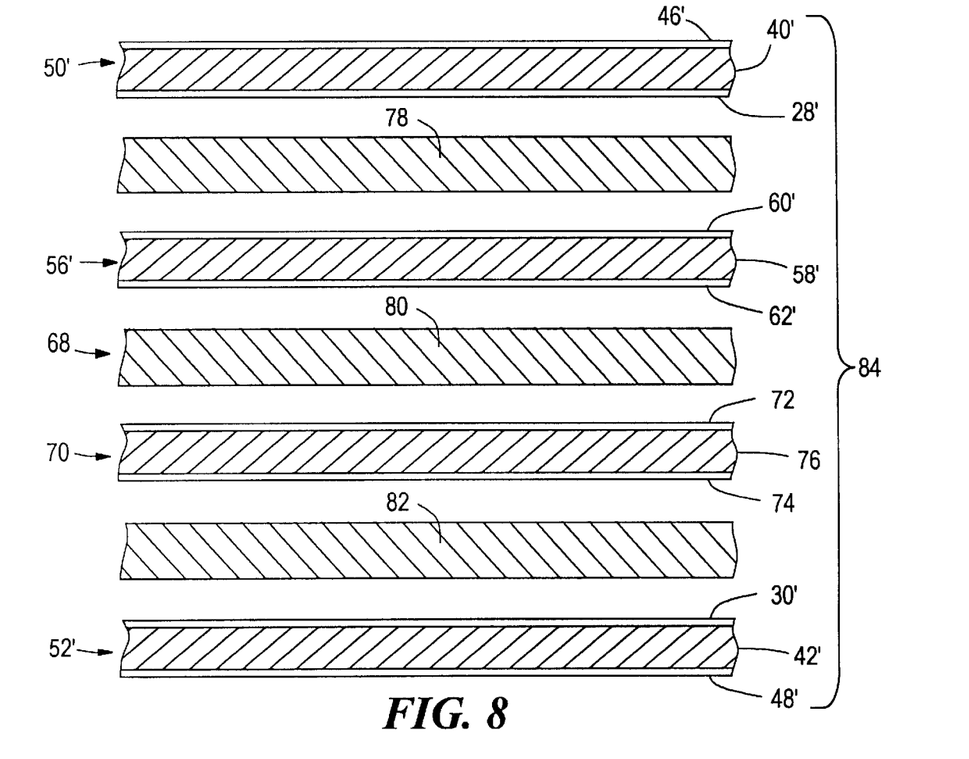

Referring now to FIG. 8, another exploded assembly of components is generally indicated at 68 for forming a capacitive PCB. The assembly 68 includes lamination products 50', 52' and 56' similar to the lamination products of FIG. 7. In addition, the assembly 68 includes another lamination product 70 formed from conductive foils 72 and 74 laminated to a dielectric sheet 76.

Uncured sheets of dielectric material respectively indicated at 78, 80 and 82 are then respectively arranged between adjacent pairs of conductive foils 28', 60'; 62', 72 and 30', 74. The components of the assembly 68 are then similarly subjected to heat and pressure in a conventional final lamination step for forming a resulting PCB with simultaneous in situ formation of a compound bypass capacitive subassembly 84 including five capacitor elements formed respectively by adjacent conductive foils and intervening dielectric sheets.

In the method according to the present invention described above with reference to FIGS. 7 and 8, it may be seen that alternate capacitor elements are formed by lamination or the conversion of uncured dielectric sheets to a fully cured condition while the other capacitor elements are laminated together prior to the final lamination step described above. In this regard, it is essential to the present invention that at least one of the capacitor elements be formed by conversion of an uncured sheet of dielectric to a fully cured condition as described above.

The capacitive PCBs described above with reference to the figures are designed to provide necessary capacitance for all or a substantial number of devices mounted thereupon. The devices may be interconnected with the power and ground planes either by separate through-hole pins or by surface traces of the type illustrated respectively in FIGS. 2 and 3. With the compound bypass capacitive subassemblies illustrated in FIGS. 7 and 8, the power and ground planes are respectively interconnected in order to assure parallel operation of the capacitor elements in each subassembly.

Because of the very substantial capacitance required for the combined devices, the capacitive PCBs of the present invention are preferably contemplated for operation based on the concept of borrowed capacitance as discussed above wherein the total capacitance of the capacitor elements in any of the capacitive PCBs is less than the total required capacitance for all of its devices. However, as noted above, the invention contemplates that any of the capacitive PCBs may be provided with sufficient capacitance equal to or greater than the cumulative capacitance requirements of the devices. This would of course permit simultaneous operation of all of the devices on the PCB. As noted above, higher capacitive values may be obtained either by an increased number of capacitor elements in the PCB and/or by the use of higher dielectric constant materials in the capacitor elements.

As was also noted above, the conductive foils in the capacitive PCBs are preferably formed with a sufficient mass of copper or conductive material per unit area in order to achieve structural rigidity or self-support and also preferably to permit sufficient electron flow or current flow in accordance with the concept of borrowed capacitance. More specifically, it is contemplated that each of the conductive foils be formed with at least about 0.5 ounces of copper per square foot, that mass corresponding generally to a thickness of about 0.5 mils, more specifically about 0.6–0.7 mils. The thickness of the conductive sheets may be increased, for example, in order to meet larger voltage or current carrying capacities for the power and ground planes in a particular application. Preferably, each of the conductive sheets includes about 1–2 ounces of copper per square foot, those masses corresponding to thicknesses for the individual sheets in the range of about 1.2–2.4 mils. More preferably, the conductive foils are formed with about one ounce of copper per square foot or having a thickness in the range of about 1.2–1.4 mils to achieve optimum performance of the capacitor laminates. That amount of copper in each of the conductive foils is also selected as a minimum for achieving good structural rigidity within the conductive sheets alone prior to their lamination into the capacitor elements.

The composition and thickness of the dielectric sheets are selected to achieve necessary capacitance, again in accordance with the concept of borrowed capacitance, and also to achieve structural rigidity for the dielectric sheets both prior to and after inclusion within the compound capacitive subassembly.

The present invention preferably contemplates the use of dielectric material having a dielectric constant of at least about 4. A substantial number of dielectric materials are available in the present state-of-the-art having dielectric constants in the range of about 4–5. Furthermore, it is possible to formulate dielectric compositions, for example, from ceramic filled epoxies, with dielectric constants ranging up toward 10 for example. Thus, the present invention preferably contemplates use of a material with a dielectric constant of at least about 4, more preferably within a range of about 4–5 and most preferably about 4.7, at least for the specific composition contemplated in the preferred embodiment. However, much higher capacitances are also contemplated, as discussed herein.

A preferred dielectric constant can be achieved by combinations of a woven component and a resin component combined together to form the necessary combination of dielectric constant and structural rigidity. The woven component may include polymers such as polytetrafluoroethylene (available under the trade names TEFLON and GORETEX) and epoxies. However, the woven components are preferably formed from glass which may be of a quartz variety but is preferably silica, the glass being formed in threads which are then woven together to form sheets filled or impregnated with a selected resin. The resins are commonly selected for fire retardant characteristics and may include materials such as cyanate esters, polyimides, kapton materials and other known dielectric materials. However, the resin is preferably an epoxy, again in order to take advantage of the existing state-of-the-art regarding use of such resins in PCB manufacture.

A dielectric sheet formed from a single woven layer of glass and about 70.0% by weight resin has the preferred dielectric constant of 4.7 as noted above while also exhibiting good structural rigidity at a thickness of about 1.5 mils.

The thickness of the dielectric material in the present invention is selected not only to achieve the desired capacitance but also to assure electrical integrity, particularly the prevention of shorts developing between the conductive foils in the capacitor elements. Common practice contemplates treatment of the surfaces of the conductive sheets adjacent the dielectric sheet in order to enhance adhesion within the capacitor elements. Such adhesion is necessary not only for structural integrity but also to assure proper electrical performance. Typically adjacent surfaces of the conductive foils are treated by deposition in zinc or zinc and copper (a brass alloy), usually by plating, in order to form roughened surfaces in a manner well known to those skilled in the PCB art. These roughened surfaces provide "tooth" to enhance mechanical bonding to the dielectric material.

The dielectric material, also referred to herein as the dielectric sheet or dielectric component, more preferably in the range of about 0.5–50 mils, even more preferably in the range of about 0.5–4 mils where the dielectric sheet has a relatively low dielectric constant and possibly most preferably in the range of about 0.5–2 mils since the resulting capacitance is dependent upon the overall thickness of the dielectric sheet or component. The greater thicknesses referred to above are particularly contemplated for embodiments of the invention disclosed herein where a relatively high dielectric constant is provided.

Another aspect of the invention is noted with respect to characteristics of the conductive foils. In accordance with standard practice, each of the conductive foils commonly has a matte or tooth side and a barrel or smooth side. Surface variations of the tooth side of the conductive foils is substantially greater than for the opposite smooth side. Such conductive foils are commercially supplied by a number of sources including Gould Electronics and Texas Instruments. Conductive foils formed from copper are available from Gould under the trade name "JTC" FOIL as described in Gould Bulletin 88401 published by Gould, Inc., Eastlake, Ohio in March 1989. Other foils available from Gould include those available under the trade names LOW PROFILE "JTC" FOIL and "TC/TC" DOUBLE TREATED COPPER FOIL and described respectively in Bulletin 88406 and Bulletin 88405, both published in March 1989 by Gould, Inc.

In the capacitor elements of the present invention, the greater surface differential for the rough side of the foil is generally excessive for preferred dimensions of dielectric as noted above. This is a consideration in the present invention since, for certain of the conductive foils, both surfaces of those foils are employed in different capacitor elements. In order to assure "capacitive integrity", that is, absence of shorts, etc., the present invention contemplates a number of different approaches for overcoming this problem.

Initially, the thickness of the dielectric sheets may be increased adjacent the rough sides of the conductive foils in order to assure adequate spacing between all surface portions of opposing conductive foils. Alternatively, the surface variations for the rough side of the foil may be reduced, for example by further calendaring or scrubbing. Generally, a calendaring operation as contemplated for compacting ductile material of the foil in order to reduce surface variations on the rough side thereof. In a scrubbing or abrading operation, some of the conductive foil material would be removed on the rough side again for the purpose of reducing surface variations thereon. The use of a scrubbing or abrading technique might require a somewhat thicker conductive foil if excessive amounts of material are to be removed.

Different forms of copper may thus be used as the conductive foil, depending particularly on the type of PCB or application.

For example, ED Copper (or electro-deposited copper) typically has a smooth or "barrel" side and a relatively rough or "tooth" side. This type of copper has relatively limited ductility and may exhibit undesirably low flexibility properties, particularly in flexible PCBs. However, ED Copper also exhibits an absence of directionally oriented grain so that it may provide superior electrical performance, especially in transverse directions with the conductive foil of a capacitive laminate within a PCB.

By contrast, RA Copper (or rolled, annealed copper) is further processed by rolling (or calendaring or extruding) and annealing both surfaces of the copper foil. This results in a foil which is substantially smooth on both sides and which exhibits substantially greater ductility. The relatively smooth surfaces on both sides of the foil may be desirable in some applications, for example, very thin capacitive laminates. The greater ductility may be particularly desirable, for example, in capacitor laminates included in flexible PCBs. However, the further processing of the RA Copper does tend to form a directional grain so that conductive foils may exhibit different electrical characteristics in X and Y directions.

Accordingly, either rolled, annealed copper (or its equivalent) or electro-deposited copper (or its equivalent) may be preferred in different applications for conductive foils in capacitor laminates made in accordance with the present invention.

Yet another approach in this regard is to coat the rough side of the conductive foil, for example with oxide, again for the purpose of reducing surface variations. In this regard, it is also noted that both surfaces of the conductive foils are preferably surface treated in a generally conventional manner in order to assure adhesion to adjacent layers, in the case of the present invention, the dielectric sheets.

One or more additional embodiments of the invention are also possible. specifically with reference to prior art patent discussed in greater detail below, and in accordance with FIGS. 9 and 10 of the drawings.

Figure 9:
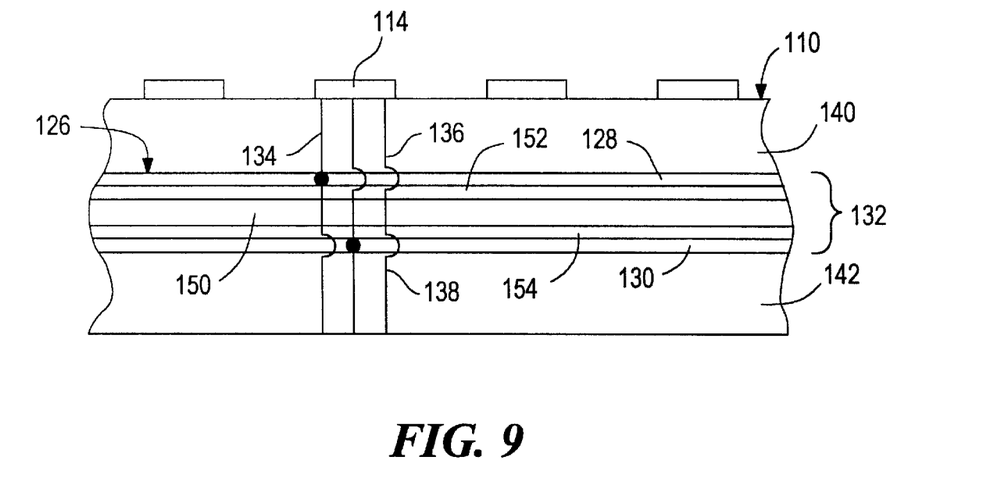
FIG. 9 is a schematic sectional view of a printed circuit board generally similar to FIG. 4 while representing still further embodiments of the invention.

In FIG. 9, a bypass capacitor element or sub-assembly 126 corresponding to the element or subassembly 26 in FIG. 4 for example, is constructed with a dielectric component 132 formed from a number of components rather than being a single dielectric sheet 32 as indicated in FIG. 4. More specifically, the dielectric component 132 includes a centrally arranged layer or sheet of dielectric material indicated at 150. Separate sheets of thermally responsive material are indicated at 152 and 154 on opposite sides of the dielectric sheet 150. The thermally responsive sheets 152 and 154 may correspond to the uncured epoxy or other polymer preferably employed in the dielectric sheet 32 of FIG. 4. However, the term "thermally responsive" is employed herein since lamination can be achieved with other polymer systems which are not necessarily "uncured", as discussed in greater detail below.

Otherwise, the PCB embodiment of FIG. 9 includes additional components corresponding to the PCB of FIG. 4. Accordingly, in FIG. 9, the conductive foils 128 and 130 correspond to the conductive foils 28 and 30 of FIG. 4. The PCB of FIG. 9 is also provided with additional layers 140 and 142 as well as a surface device 114 and power and ground leads 134 and 136 corresponding respectively to the components indicated at 40 and 42, 14', and 34 and 36 in FIG. 4.

In FIG. 9 all of the components of the bypass capacitor element or subassembly 126 are illustrated in contiguous relation representing their lamination into the PCB 10' of FIG. 4 or 110 of FIG. 9 during final lamination thereof.

Figure 10:
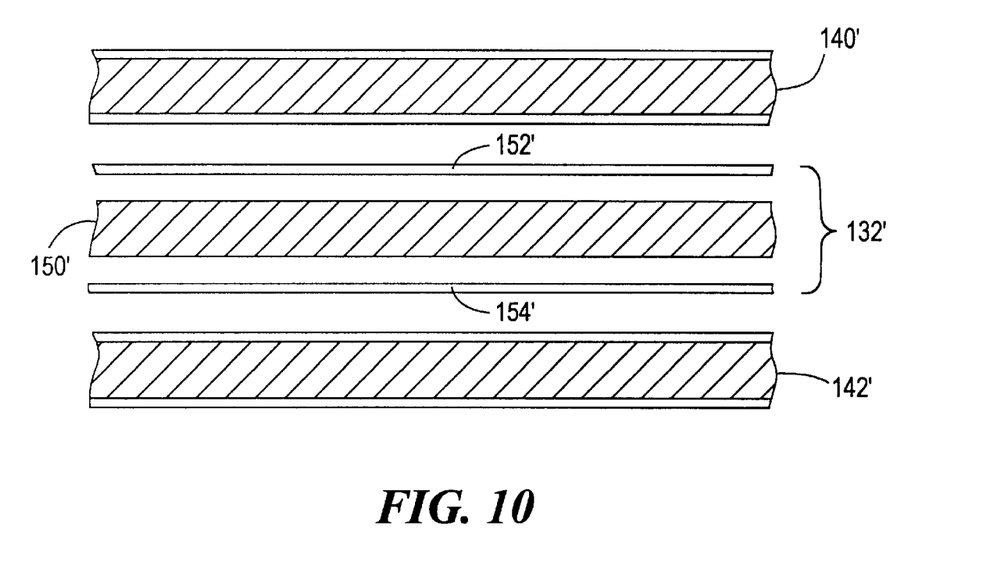
FIG. 10 illustrates an exploded assembly of components suitable for forming a capacitive PCB according to the in situ method of the present invention and specifically in connection with the embodiments referred to above in connection with FIG. 9.

The components of FIG. 9 are also illustrated in generally exploded relation in FIG. 10 to better represent arrangement of those components within the PCB 110 prior to final lamination. In other words, the bypass capacitor element or subassembly 126 of FIG. 9 is formed by the initially separate dielectric sheet 150 and the two thermally responsive sheets 152 and 154 as well as the conductive foils 128 and 130 initially forming portions of the adjacent layers of the PCB respectively indicated at 140' and 142' in FIG. 10.

Thus, in the preferred embodiments of the invention described below, the bypass capacitor element or subassembly 26 may be formed with a single layer of thermally responsive material preferably corresponding to the single dielectric sheet 32 illustrated in FIG. 4. However, it is also possible to form the bypass capacitor element or subassembly 126 with two thermally responsive sheets 152 and 154 in addition to a separate, centrally arranged dielectric material or sheet indicated at 150. More specifically, the dielectric sheet 150 may be formed from a monolithic layer of dielectric material such as ceramic or it may be formed from a carrier such as a polymer of the type described elsewhere herein and including the dielectric material as a filler. Regardless of the formation of the dielectric sheet 150, the two thermally responsive sheets 152 and 154 are provided on opposite sides thereof because of their ability to form a laminate between the dielectric sheet 150 and the adjacent conductive foils 128 and 130 during final lamination of the PCB 110. Furthermore, the configuration for the PCB 110 described with reference to FIGS. 9 and 10 makes possible the use within the present invention of a number of different materials described in greater detail below with reference to specific prior art patents. Generally, these patents are discussed below in order to provide a broader range of both dielectric materials forming the basis for the bypass capacitor element or subassembly 126 and different polymers which may be employed either as a carrier within the dielectric sheet 150 or to form the thermally responsive sheets 152 and 154. In this regard, it is to be noted that the polymers forming the thermally responsive sheets 152 and 154 must be capable of providing lamination both to the dielectric sheet 150 and to the conductive foils 128 and 130 during final lamination of the PCB 110.

Paurus, et al. U.S. Pat. No. 5,162,977, issued Nov. 10, 1992 under assignment to Storage Technology Corporation, Louisville, Colo., and entitled PRINTED CIRCUIT BOARD HAVING AN INTEGRATED DECOUPLING CAPACITIVE ELEMENT disclosed a PCB with a high capacitance power distribution core comprising a signal to ground plane and a power plane separated by a dielectric core element having a high dielectric constant.

Paurus, et al. also disclosed various high capacitance core materials. For example, in one embodiment, the core element was composed of glass fiber impregnated with a ceramic loaded bonding material. An example of the contemplated bonding material is an epoxy resin loaded with a ferro-electric ceramic filler having a high dielectric constant such as lead zirconate titanate (PZT). Here, PZT is a solid solution of lead zirconate ($PbZrO_3$) and lead titanate ($PbTiO_3$) and is in the class of materials called "perovskites".

Other suitable high dielectric constant ferro-electric materials contemplated by Paurus, et al. include those having a Curie temperature $T_c$ somewhat above the operating temperature of the PCB (e.g., Tc=50–100° C.). Other perovskites and ferro-electric materials also suitable as high dielectric components were further disclosed.

Paurus, et al. alternatively disclosed certain para-electric materials as being suitable for loading the epoxy resin. Para-electric materials exhibit a high dielectric constant range at temperatures somewhat above its Curie temperature. Materials having Curie temperatures somewhat below the PCB operating temperature (e.g. $T_c$=−70–0° C.) would be suitable candidates.

Paurus, et al. further disclosed a class of ferro-electric compositions also suitable for loading the epoxy resin known as "sol-gels". These compositions are made from liquid based alkoxide precursors such as lead acetate [Pb$(CH_3COO)_2$3—$H_2O$], titanium (IV) isopropoxide [Ti$(OC_3H_7)_4$], and zirconium n-propoxide [Zr$(OC_3H_7)_4$].

Under the method of the Paurus, et al. patent, wherein a relatively low dielectric constant epoxy bonding material was loaded with a high dielectric constant filler, the effective dielectric constant of a composite may be derived using the "Lichtenecker's mixing rule" empirical relationship. Here, the various volume ratios of the composite constituents may be manipulated to obtain a targeted effective dielectric constant of the resultant core material.

In addition to manipulation of the dielectric filler-to-glass cloth ratio, Paurus, et al. taught that higher capacitance may be achieved by employing multiple-layer core elements. Here, a multiple-layer core may be comprised of a plurality of high capacitance core elements (as discussed previously) laminated between copper foil layers to provide increased capacitance relative to a single core element.

Also under Paurus, et al., a common insulating laminate designated FR-4 was based for example on a typical epoxy resin system referred to as a bisphenol A (BPA)-based system. Paurus, et al. further disclosed a number of insulating polymers which could be used as a substitute for the epoxy resin used in the FR-4 composite.

Within the present invention, the dielectric materials and resin systems or components disclosed by Paurus, et al. may be employed in one or more embodiments of the present invention. In particular, both the dielectric material and resin components may be employed in the dielectric sheet 32 or 32' of FIGS. 4 and 5. However, those dielectric materials and resins can also be employed in the embodiments of the other figures, particularly the embodiment of FIGS. 9 and 10. Referring to those figures, the dielectric material and resin systems disclosed by Paurus, et al. may be employed in combination within the dielectric material or sheet 150.

Accordingly, the Paurus, et al. patent is incorporated herein as though set forth in its entirety.

For the resin components disclosed by Paurus, et al. to be directly suitable for example in the embodiment of FIGS. 4 and 5, it would be necessary for the resins to be thermally reactive, as defined above for the present invention. Even if the resins were not thermally reactive in this regard to achieve bonding within a PCB in a final lamination step, it would still be possible to employ the resin to form the dielectric sheet 150 in the embodiment of FIG. 9. Thermally reactive or responsive sheets as defined above and illustrated in FIG. 9 at 152 and 154 could then be employed to achieve bonding between the dielectric sheet 150 and adjacent conductive foils 128 and 130.

Accordingly, it is suitable to employ either the dielectric materials and/or the resin components from the Paurus, et al. disclosure in the in situ process of the present invention. This inclusion extends to the embodiments of the other figures as well as FIGS. 4, 5 and 9, 10 discussed specifically above. To further emphasize how certain of these materials could be employed within the present invention, specific portions of the Paurus, et al. specification are directly quoted below in order indicate their possible relevance to the present invention.

Paurus, et al. more specifically summarized their dielectric material as follows:

The ferro-electric ceramic substance (used for loading the epoxy resin) is first ground to a nanopowder (i.e., wherein the average particle radius is less than 0.5 microns). The nanopowder is then combined with an epoxy resin to form the bonding material with which the glass cloth or other insulating structural medium is impregnated. Grinding the ceramic substance into a fine powder increases the internal surface area of the substance without increasing the volume fraction, and thus provides for a higher dielectric constant and a corresponding higher capacitance to surface area ratio.

A printed circuit board core using a glass fiber/nanopowder loaded (filled) epoxy construction may typically exhibit a capacitance of 0.1 microfarads per square inch, which is an improvement of up to 4 orders of magnitude over the prior art. A printed circuit board core with such capacitance characteristics typically requires no additional decoupling for the associated printed circuit board components, and thus obviates the need for decoupling capacitors which are mounted externally on the printed circuit board.

Paurus, et al. specifically describe one embodiment wherein the high capacitance core element is composed of glass fiber impregnated with a ceramic loaded bonding material. The bonding material is, for example, epoxy resin loaded with a ferro-electric ceramic filler having a high dielectric constant, such as lead zirconite titante (PZT). PZT is a solid solution of lead zirconate ($PbZrO_3$) and lead titanate ($PbTiO_3$) FR-4 (epoxy-glass cloth) is the type of laminate that has found the widest acceptance as a bonding and insulating medium for printed circuit boards. However, as discussed below, other insulating materials may also be used in the present invention in place of FR-4 laminate, and other high dielectric constant materials may be substituted for PZT to load the epoxy resin. Additional suitable high dielectric constant ferro-electric materials are those having a Curie temperature $T_c$ that is somewhat above the operating temperature of the printed circuit board (e.g., $T_c$=50 to 100 degrees C.). The class of materials called perovskites (which include PZT) are further examples of alternative ferro-electric materials. In addition to PZT, other perovskites having suitably high dielectric constants include, but are not limited to barium titanate, as well as PZT or barium titanite with calcium, bismuth, iron, lanthanum, or strontium additives. Other alternative ferro-electric materials include materials with a tungsten-bronze crystal structure, including, but not limited to lead meta-niobate ($PbNb_2O_6$), lead metatantalate ($PbTa_2O_6$), sodium barium niobate ($NaBa_2Nb_5O_{15}$), potassium barium niobate ($KBa_2Nb_5O_{15}$), rubidium barium niobate ($RbBa_2Nb_5O_{15}$), as well as the preceding five tantalate/niobate compounds with bismuth, lanthanum, or strontium additives.

As noted above, Paurus, et al. further disclosed the use of high dielectric constant sol-gels as a category of suitable epoxy resin loading materials having high dielectric constants including materials made from a class of ferro-electric compositions referred to as "sol-gels." Sol-gels are made from liquid based Alkoxide precursors, such as lead acetate [$Pb(CH_3COO)_2 3$—$H_2O$], titanium (IV) isopropoxide [$Ti(OC_3H_7)_4$], and zirconium n-propoxide $Zr(OC_3H_7)_4$]. A stock solution is formed by combining the distilled solutions of the two separate precursor solutions. The first precursor solution contains a mixture of lead acetate and titanium isopropoxide in a common solvent of 2-Methoxyethanol. The second precursor solution contains a mixture of lead acetate and zirconium n-propoxide in a common solvent of 2-Methoxyethanol. The concentrations of the precursor chemicals used in the sol-gel process is well-known in the art; however, a concentration of 1.5 g-moles of total metallic elements (Pb+Zr+Ti) per liter of precursor solution is presently preferred. It is to be noted that other Alkoxide/solvent combinations may be used to obtain a sol-gel suitable for use in the present invention. The Alkoxide precursors go through a gel-forming stage after hydrolization at less than 200° C. After the selected Alkoxide/solvent stock solution is mixed with the hydrolizing solution it is heated and dried to form an amorphous phase of the ferro-electric material. The resulting solidified sol-gel is then sintered at a temperature of ~600° C. to achieve a high dielectric phase ferro-electric ceramic material having a dielectric constant as high as 10,000 to 20,000. (The sol-gel process is described in "Properties of Very Thin Sol-Gel Ferroelectrics," Sanchez, et al., Proceedings of the Second Symposium on Integrated Ferroelectrics, *Ferroelectrics*, Vol. 116, pp. 1–17, Gordon and Breach Science Publishers, 1991.)

The Paurus, et al. patent included a flow chart showing process steps which are performed in constructing the high capacitance core printed circuit board of the present invention. After the dielectric filler material has been prepared, (e.g., by grinding the dielectric material to a fine powder), the FR-4 epoxy is then loaded with the dielectric material. The dielectric/epoxy mixture is used to impregnate a section of fiberglass cloth to produce a semi-cured pre-preg capacitive core sheet. The pre-preg core sheet is then cut into circuit board-sized power distribution core elements. Next, a layer of copper foil is laminated to each side of each core element, thus completing the high capacitance power distribution core, with one copper foil layer providing a power plane and the other layer providing a ground plane.

In connection with the effective dielectric constant of composite material, Paurus, et al. further discussed that when two materials having widely differing dielectric properties are combined (i.e., a high dielectric constant filler and a relatively low dielectric constant epoxy bonding material), the resultant effective dielectric constant of the combination varies considerably with the ratio of the two materials. In order to determine the capacitance of the core element of the present invention, the effective dielectric constant of the combination of materials in the core element must first be determined.

Mixed dielectric constant systems are theoretically quite complicated, especially when the permittivities and conductivities of the constituent phases differ considerably. The subject can be simplified, however, by addressing the dielectric constant of a mixture of two isotropic phases, given their dielectric constants. A widely used empirical relationship (due to Lichtenecker) is represented by:

$$\log K'_r = v_1 \log K'_1 + v_2 \log K'_2 -$$

here $K'_r$=effective (resultant) dielectric constant, $v_1$ and $v_2$ are volume fractions of the constituents in a two phase mixture, and $K'_1$ and $K'_2$ are the corresponding dielectric constants of each phase in the mixture. In using this relationship, there is no concern for the physical geometry of the system.

Paurus, et al. further noted that, by employing a fiberglass-epoxy core element having a 70% by volume PZT nanopowder filler, a composite dielectric constant of greater than 1000 is practicably achievable in accordance with the present invention. Therefore, utilizing a printed circuit board core element having, for example, a dielectric constant of 1000, and a core element thickness of approximately 2 mils (0.002 inch) provides for a 0.1 microfarad per square inch core element capacitance. This capacitance to area ratio provides a total capacitance of 5 microfarads on a printed circuit board with a typical surface area of 50 square inches. Such a total capacitance is sufficient to totally eliminate the need for decoupling capacitors on a typical printed circuit board.

Paurus, et al. further noted that increased core capacitance could be achieved by using materials with higher dielectric constants, by increasing the dielectric filler-to-glass cloth ratio, by using lower density cloth materials, and/or by employing multiple-layer core elements. In their patent, Paurus et al. disclose an alternative multiple-layer high capacitance core in accordance with their invention. The multiple-layer core is comprised of a plurality of high capacitance core elements (as described above) laminated between copper foil layers thereby providing for increased capacitance relative to a core having a single core element. Fiberglass panels are then laminated, as required, to the core as in the foregoing description.

Finally, Paurus, et al. describe one insulating, laminate as being most widely used in the manufacture of printed circuit boards, that laminate being designated FR-4, which is a fire-retardant, epoxy-impregnated glass cloth composite. The typical epoxy resin used in FR-4 composite is the diglycidyl ether of 4,4'-bis(hydroxyphenyl) methane, or low-molecular weight polymers thereof. This is referred to as a bisphenolA (BPA)-based system. Fire retardancy is imparted by including enough tetrabromobisphenol-A with the BPA to provide 15% to 20% bromine content. The curing agent typically used for the epoxy resin is dicyandiamide (DICY). The catalyst or accelerator is usually a tertiary amine, such as tetramethyl butane diamine, 1,3 bis (dimethyl amino) butane (TMBDA).

Even further, Paurus, et al. noted that a number of insulating polymers could be used as a substitute for the epoxy resin used in FR-4 composite. Examples include, but are not limited to, thermoplastics such as acetals and related copolymers; acrylics; cellulosics; fluoroplastics; ketone-based resins; nylons (poly-amides); polyamide-imides; plyarylates; polybutylenes; polycarbonates; polyesters; polystryrenes; polyether sulfones; polyphenylene oxides; polyphenylene sulfides; certain liquid crystal polymers; and mixtures and/or copolymers thereof. Other insulators which could be substituted for the FR-4 epoxy resin are thermosetting resins including, but not limited to, epoxy resins (other than FR-4); unsaturated polyester resins; vinyl resins; phenol resins; melamine resins; polyurethane resins; polyvinyl-butylral resins; polyamide-imide resins; polyimide resins; silicone resins; and mixtures and/or copolymers thereof.

These portions of the Paurus, et al. specification are specifically set forth herein to indicate their particular suitability for inclusion in the present invention as also noted above.

Similarly, Fischer U.S. Pat. No. 4,996,097, issued Feb. 26, 1991 under assignment to W. L. Gore & Associates, Inc., Newark, Del., and entitled HIGH CAPACITANCE LAMINATES disclosed various high capacitance laminates made of thin films of polytetrafluoruethylene filled with large amounts of dielectric filler, in which the films are plated or clad with conductive material.

Obviously, the high capacitance laminates disclosed by Fisher may be employed in various embodiments of the present invention in the same manner set forth above in connection with the Paurus, et al. patent. Accordingly, the Fischer patent is also incorporated herein by reference as though set forth in its entirety. The suitability for various components of the Fischer disclosure to be used in the present invention is further emphasized by the following language quoted from the Fischer specification:

Dielectric fillers useful within either the Fischer invention or the present invention were noted as including any commonly known filler particulate that has a high dielectric constant. By "particulate" is meant individual particles of any aspect ratio and thus includes fibers and powders. Preferably the filler will be smaller than 40 microns and most preferably less than 20 microns average size, and preferably will be titanium dioxide or barium titanate or a ferroelectric complex. Filler concentration in the film will be between about 25–85 volume percent, and the dielectric constant will be at least 7.

In order to obtain the desired degree of thinness, namely between 0.0001 and 0.005 inches, it is preferred to make the filled films by:

(a) mixing 25–85 volume percent particulate filler of an average size of 40 micron or less with polytetrafluoroetyhylene in aqueous dispersion, (b) cocoagulating the filler and the polytetrafluoroethylene, (c) lubricating the filled polytetrafluoroethylene with lubricant and paste extruding the lubricated materials to form a film, (d) calendaring the lubricated film, (e) expanding said film by stretching it so as to form a porous polytetrafluoroethylene having said filler distributed therein, (f) in either order, laminating the conductive metal, and densifying the stretched material by compressing it until the desired thickness is obtained.

By expanding the polytetrafluoroethylene, as described in U.S. Pat. No. 3,543,566, to form an expanded porous film comprised of nodes interconnected with fibrils, the filler particles appear to collect around the nodes and thus do not rub or roll to any appreciable extent when subjected to compaction. Thus the expanded, filled PTFE can be densified to form very thin films that are substantially free of pinholes or tears.

Fischer also disclosed a preferred manner for laminating conductive foil to the thin film of dielectric material in order to provide a laminate for use as a capacitor. Fischer further noted that an organic polymer, such as a thermoset resin, could be present in the thin film, for example, to lower lamination temperatures and improve adhesion of conductive metal to the film.

Accordingly, the Fischer patent disclosed a dielectric laminate comprising a thin film of filled polytetrafluoroethylene, containing 25–85 volume percent particulate filler having a high dielectric constant, having film thickness of between 0.0001 and 0.005 inches, being substantially free of visual pinholes, and having a matrix tensile strength of at least 2600 psi. Preferably, the thin film of dielectric laminate had a conductive foil attached to at least one side for forming a capacitive laminate also suitable for use in the present invention.

Fischer also specified his laminate having a dielectric constant of at least 7, the filler for the dielectric laminate being $TiO_2$ or barium titanate or a ferroelectric complex, the dielectric laminate preferably having a capacitance of greater than 650 picofarads per square inch and a break strength of at least 1500 psi, the dielectric laminate preferably containing a thermoset resin for purposes noted above.

Hernandez U.S. Pat. No. 4,908,258, issued Mar. 13, 1990 under assignment to Rogers Corporation, Rogers, Conn., and entitled HIGH DIELECTRIC CONSTANT FLEXIBLE SHEET MATERIAL disclosed a high capacitance flexible dielectric sheet material comprised of a monolayer of multilayer or single layer high dielectric (for example ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric (for example ceramic) chips together. Next, the opposite planar surfaces of the array (including the polymer) are electroless plated or electroded by vacuum metal deposition, or sputtering, to define opposed metallized surfaces. The end result is a relatively flexible high capacitance dielectric film or sheet material which is drillable, platable, printable, etchable, laminable and reliable.

Accordingly, the dielectric sheet material disclosed by Hernandez is also useful within various embodiments of the present invention. For these reasons, the Hernandez patent is incorporated herein by reference as though set forth in its entirety.

Here again, portions of the Hernandez patent are quoted below to emphasize their suitability for use within the present invention. For example, the Hernandez specification illustrated a high dielectric constant flexible polymeric sheet material, the flexible sheet being comprised of a monolayer of high dielectric constant pellets or chips which are of relatively small area and thickness and are arranged in a planar array. The chips are separated from each other by a small distance to define spaces therebetween. The spaces between the chips are filled with a suitable polymeric material. Polymeric material acts as a binder to hold the array of high dielectric constant pellets together. Significantly, polymeric material will contact only the sides of pellets and will be out of contact with the top and bottom surfaces and of each pellet. This will result in both end surfaces of high dielectric pellets and end surface of polymeric binder being exposed. Next, these opposed and exposed surfaces of the pellet array and polymer are metallized to define a thin (for example about 10–50 micro inches) metallized layer. These thin metallized layers may then be plated up to higher thicknesses (for example about 1–2 mils) by well known electroplating techniques to define the layers. The thin metallized layers may be produced using any known method including by electroless plating or by vapor deposition techniques including vacuum deposition, sputtering, etc.

Hernandez further noted that the material used to produce the high dielectric constant pellets may be any suitable high dielectric constant material and is preferably a high dielectric constant ceramic material such as $BaTiO_3$. In addition, other known high dielectric ceramic materials may be utilized including lead magnesium niobate, and iron tungsten niobate. It will be appreciated that by "high" dielectric constant, it is meant dielectric constants of over about 10,000. As mentioned, the pellets are relatively small and are preferably cylindrical in shape having a height of 0.015" and a diameter of 0.020". If a ceramic is used, the pellets should be fully sintered prior to being bonded together by the polymer.

Hernandez further noted that other configurations for the pellets could be used in addition to cylinder with conductive foil preferably being formed on one or both surfaces of the dielectric material, for example by electroless plating.

Hernandez further taught that the pellet array was impregnated with a suitable polymer which may be either a flexible thermoplastic or a flexibilized thermoset (epoxy, polyetherimide, polyester, etc.) to give the array mechanical strength and electrical insulating stability with temperature, moisture, solvents, etc. The polymeric material should be a high temperature (approximately 350° F.) polymer which is somewhat flexible and has a dielectric constant of between about 4–9. Preferred materials include polyetherimides, polyimides, polyesters and epoxies. It will be appreciated that the flexibility is necessary to preclude cracking of the sheet under stress.

Obviously, the dielectric materials and/or arrays disclosed by Hernandez could also be used within various embodiments illustrated in different figures of the present invention in a similar manner discussed for the Paurus, et al. patent above.

Hernandez, et al. U.S. Pat. No. 4,748,537, also under assignment to Rogers Corporation, Rogers, Conn., and entitled DECOUPLING CAPACITOR AND METHOD OF FORMATION THEREOF disclosed a hermetically sealed and automatically insertable decoupling capacitor for use in conjunction with integrated circuit DIP inserter devices having a multi-layer ceramic capacitor chip provided with conductive electrodes on the top and bottom surfaces thereof sandwiched between suitable conductive strips and insulating layers and retained within an opening formed in an insulating strip by solder or conductive adhesive. The multi-layer ceramic capacitor further includes conductive end terminations having insulative caps thereon to prevent shorting.

Here again, obviously the capacitor components of the Hernandez, et al. patent could also be employed within various embodiments of the present invention. Accordingly, the Hernandez, et al. patent is also incorporated herein by reference as though set forth in its entirety.

Portions of the Hernandez, et al. patent are set forth below to emphasize their suitability for use within the present invention:

Hernandez, et al. disclosed a preferred embodiment of their invention in a method wherein a conductor having a lead connected thereto is formed from a continuous strip of electrically conductive material, the strip having opposing planar surfaces. A dummy lead, associated with the conductor, but isolated therefrom, is also formed from the strip. Two such strips (lead frames) are then spaced apart in a parallel orientation and a strip of insulating material having a plurality of openings or windows therein is sandwiched between the two lead frames. A multi-layer ceramic capacitor chip having conductive electrodes on the top and bottom surfaces thereof is inserted into each window so that the top and bottom electrodes respectively contact a conductor from each lead frame. Preferably, conductive epoxy is used to effect an electrical and mechanical connection between the capacitor chip electrodes and the lead frame conductors. Thereafter, a top strip of outer insulating material is positioned across from one opposing surface of a first conductive strip and a bottom strip of outer insulating material is positioned on another opposing surface of a second conductive strip. The top and bottom outer insulating layers sandwiching the pair of parallel conductive strips are then heat tacked and hot press laminated to form a continuous strip of laminated material. It will be appreciated that suitable adhesive coating is provided to the several layered components during assembly and prior to lamination; the adhesive being cured during lamination. Finally, the now sealed and laminated decoupling capacitor is severed from the pair of lead frames. The decoupling capacitor of the present invention will thus be both hermetically sealed and automatically insertable for use in conjunction with integrated circuit DIP inserter devices.

Hernandez, et al. more specifically provided and described a capacitor including:

a first electrical conductor; a second electrical conductor spaced from and in alignment with said first conductor; a first active lead extending from said first conductor at a first position; a second active lead extending from said second conductor at a second position; a first dummy lead associated with said first conductor, but electrically isolated therefrom at a third position; a second dummy lead associated with said second conductor, but electrically isolated therefrom at a fourth position; central electrically insulative material between said first and second conductors, said central insulative material having a window therethrough wherein said window defines a recess communicating between said first and second conductors; at least one multi-layer capacitive element in said recess and between said first and second conductors, said capacitive element having opposed first and second conductive top and bottom surfaces, said capacitive element further comprising dielectric material having a pair of opposed end surfaces and top and bottom surfaces with said conductive top and bottom surfaces on said respective top and bottom surfaces of said dielectric material, said capacitive element also having mutually parallel interleaved conductive layers between and parallel to said conductive top and bottom surfaces, with said top conductive surface being in electrical contact with said second conductor whereby said first conductor, second conductor, conductive top surface, conductive bottom surface and interleaved conductive layers are all mutually parallel; first and second conductive end terminations on said dielectric material end surfaces with alternating layers of said interleaved conductive layers being electrically connected and defining first and second groups of conductive layers, said first group of conductive layers terminating at said first conductive end termination and said second group of conductive layers terminating at said second conductive end termination, said top conductive surface being connected and substantially transverse to said first conductive end termination, said bottom conductive surface being connected and substantially transverse to said second conductive end termination, a first gap being defined between said top conductive surface and said second end termination and a second gap being defined between said bottom conductive surface and said first end termination; an electrically insulative cap being provided over each of said first and second conductive end terminations wherein said conductive end terminations are encapsulated and wherein electrical bridging in said gap between said top conductive surface and said second end termination and in said gap between said bottom conductive surface and said first end termination is precluded by said insulative caps; electrically insulative material on said first conductor opposite said central insulative material; electrically insulative material on said second conductor opposite said central insulative material and; wherein the above elements are bonded together to form a laminated assembly.

Here again, dielectric or capacitive materials and/or configurations disclosed by Hernandez, et al. could also be employed within one or more embodiments of the present invention as described more specifically in connection with the Paurus, et al. above.

It is to be noted that certain of the dielectric components or sheets disclosed in connection with the above incorporated references may be either rigid or flexible. Generally, a dielectric sheet would be rigid if it were formed for example from a substantially monolithic sheet of a ceramic material. Flexible dielectric sheets could be employed in a broad variety of PCBs including those which are substantially flexible. In addition, rigid dielectric sheets could be employed particularly in rigid portions of so-called "rigid-flex" printed circuit boards. It would of course be difficult or impossible to include such a rigid dielectric sheet in the substantially flexible portions of such boards without resulting in fracture of the board or delamination resulting from attempted flexure of such a rigid dielectric sheet.

In any event, the problem of different surface variations on opposite sides of the conductive foil can be minimized and/or eliminated by one or more of the above techniques.

Accordingly, there have been described above a variety of methods for in situ formation of capacitive elements within PCBs during a final lamination step. Modifications and variations in addition to those described above will be apparent to those skilled in the art. Accordingly, the scope of the present invention is defined only by the following appended claims which are also set forth as further examples of the invention.

What is claimed is:

1. A capacitive printed circuit board having an internal capacitive laminate comprising
   a generally continuous sheet of dielectric material,
   conductive foils respectively arranged on opposite sides of the dielectric sheet, and
   a sheet of thermally responsive material respectively arranged between each opposite side of the dielectric sheet and one of the conductive foils to form a laminated bond therebetween.

2. The capacitive printed circuit board of claim 1 wherein the sheet of dielectric material comprises a resin component as a carrier and the sheet of dielectric material forming a filler in the resin component.

3. The capacitive printed circuit board of claim 1 wherein the printed circuit board is of a type for receiving one or more surface mounted devices and further comprising means for coupling at least one surface device with the conductive foils of the internal capacitive laminate.

4. The capacitive printed circuit board of claim 1 wherein the sheet of dielectric material has a thickness in the range of about 0.5 mils to about 50 mils.

5. The capacitive printed circuit board of claim 1 wherein the sheet of dielectric material is selected to provide a dielectric constant of at least about 4 throughout the area of the dielectric sheet.

6. The capacitive printed circuit board of claim 1 wherein the sheet of dielectric material is a nanopowder-loaded electrically insulative material including a pre-fired ceramic powder having a high dielectric constant.

7. The capacitive printed circuit board of claim 6 wherein the nanopowder-loaded material is an electrically insulating material loaded with a fine powder, the powder having a dielectric constant more than about ten times greater than a dielectric constant of the electrically insulative material.

8. The capacitive printed circuit board of claim 6 wherein the nanopowder-loaded material comprises an epoxy resin loaded with a fine powder, the powder having a dielectric constant more than about ten times greater than a dielectric constant of the epoxy resin.

9. The capacitive printed circuit board of claim 6 wherein the high dielectric constant of the pre-fired ceramic powder is greater than about 500.

10. The capacitive printed circuit board of claim 6 wherein an average radius of a particle in the pre-fired ceramic powder is less than about 1 micron.

11. The capacitive printed circuit board of claim 6 wherein the pre-fired ceramic powder comprises a ferro-electric material.

12. The capacitive printed circuit board of claim 6 wherein the pre-fired ceramic powder is a ferro-electric material selected from the group of materials having a tungsten-bronze crystal structure comprising lead meta-niobate, lead meta-tantalate, sodium barium niobate, potassium barium niobate, and rubidium barium niobate.

13. The capacitive printed circuit board of claim 12 wherein any of the materials in the group of materials having the tungsten-bronze crystal structure is combined with an additive selected from the group comprising bismuth, lanthanum, and strontium.

14. The capacitive printed circuit board of claim 1 wherein the sheet of dielectric material comprises a thin film of filled polytetrafluoroethylene:
   (1) containing from about 25 to about 85 volume percent particulate filler having a high dielectric constant,
   (2) having a film thickness of between about 0.0001 and about 0.005 inches,
   (3) being substantially free of visual pinholes, and
   (4) having a matrix tensile strength of at least about 2600 psi.

15. The capacitive printed circuit board of claim 14 wherein the sheet of dielectric material has a dielectric constant of at least about 7.

16. The capacitive printed circuit board of claim 14 wherein the particulate filler is titanium dioxide or barium titanate or a ferro-electric complex.

17. The capacitive printed circuit board of claim 14 wherein the thin film contains a thermoset resin.

* * * * *